(12) United States Patent
Kronholz et al.

(10) Patent No.: US 9,269,631 B2
(45) Date of Patent: Feb. 23, 2016

(54) INTEGRATION OF SEMICONDUCTOR ALLOYS IN PMOS AND NMOS TRANSISTORS BY USING A COMMON CAVITY ETCH PROCESS

(75) Inventors: Stephan Kronholz, Dresden (DE); Vassilios Papageorgiou, Austin, TX (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 1243 days.

(21) Appl. No.: 12/710,403

(22) Filed: Feb. 23, 2010

(65) Prior Publication Data
US 2010/0219475 A1 Sep. 2, 2010

(30) Foreign Application Priority Data
Feb. 27, 2009 (DE) .......................... 10 2009 010 847

(51) Int. Cl.
| | | |
|---|---|---|
| H01L 27/12 | (2006.01) | |
| H01L 21/86 | (2006.01) | |
| H01L 21/8238 | (2006.01) | |
| H01L 29/78 | (2006.01) | |

(52) U.S. Cl.
CPC ....... *H01L 21/823807* (2013.01); *H01L 21/823814* (2013.01); *H01L 29/7848* (2013.01)

(58) Field of Classification Search
USPC .............. 257/351, 19, 55, 63, 616, 369, 374; 438/154, 199, 219, 300, 377, 552, 553, 438/671, 717, 736, 752
See application file for complete search history.

(56) References Cited

U.S. PATENT DOCUMENTS

| | | | | |
|---|---|---|---|---|
| 4,843,025 | A * | 6/1989 | Morita .......................... | 438/388 |
| 6,274,455 | B1 * | 8/2001 | Seo ............................... | 438/400 |
| 6,501,149 | B2 * | 12/2002 | Hong ............................ | 257/510 |
| 7,138,320 | B2 * | 11/2006 | van Bentum et al. ......... | 438/300 |
| 7,176,110 | B2 * | 2/2007 | van Bentum et al. ......... | 438/478 |
| 7,303,949 | B2 * | 12/2007 | Chen et al. .................... | 438/199 |
| 7,326,601 | B2 * | 2/2008 | Wirbeleit et al. ............. | 438/151 |
| 7,892,932 | B2 * | 2/2011 | Cheng et al. .................. | 438/300 |
| 2006/0118878 | A1 * | 6/2006 | Huang et al. .................. | 257/369 |
| 2007/0196989 | A1 * | 8/2007 | Kim et al. ..................... | 438/300 |
| 2007/0210314 | A1 * | 9/2007 | Winstead et al. .............. | 257/69 |
| 2008/0090349 | A1 * | 4/2008 | Hoentschel et al. .......... | 438/229 |
| 2010/0171181 | A1 * | 7/2010 | Rhee et al. .................... | 257/369 |

FOREIGN PATENT DOCUMENTS

DE   102006015090 A1   10/2007   .......... H01L 21/8234

OTHER PUBLICATIONS

Translation of Official Communication from German Patent Office for German Patent Application No. 10 2009 010 847.5 dated Dec. 15, 2009.

* cited by examiner

*Primary Examiner* — Sheng Zhu

(57) ABSTRACT

Different strain-inducing semiconductor alloys may be incorporated into the drain and source areas of different transistors in sophisticated semiconductor devices by at least patterning the corresponding cavities in a common manufacturing sequence. Thus, the etch process may be performed on the basis of a high degree of uniformity and the subsequent epitaxial growth processes may, in some illustrative embodiments, be accomplished on the basis of only one additional lithography step.

17 Claims, 7 Drawing Sheets

INTEGRATION OF SEMICONDUCTOR ALLOYS IN PMOS AND NMOS TRANSISTORS BY USING A COMMON CAVITY ETCH PROCESS

BACKGROUND OF THE INVENTION

1. Field of the Invention

Generally, the present disclosure relates to integrated circuits, and, more particularly, to the formation of different transistor types having strained channel regions by using an embedded strain-inducing material to enhance charge carrier mobility in the channel regions.

2. Description of the Related Art

Integrated circuits have found a widespread applicability in many fields due to the continuous increase of functions that may be provided on a given chip area. Integrated circuits are composed of numerous individual circuit components, such as transistors, wherein several million or even several hundred million individual transistors may be provided in complex devices. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region. The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of reduced critical dimensions for a new device generation. Moreover, highly sophisticated dopant profiles, in the vertical direction as well as in the lateral direction, are required in the drain and source regions to provide low sheet and contact resistivity in combination with a desired channel controllability.

The continuous size reduction of the critical dimensions, i.e., the gate length of the field effect transistors, necessitates the adaptation and possibly the new development of highly complex process techniques concerning the above-identified process steps. Furthermore, the reduction of the channel length typically requires additional design measures to counter the so-called short channel behavior of the transistors, wherein many of these measures may require the employment of sophisticated process techniques and materials, such as high-k gate dielectrics and the like, as the thickness of conventional gate dielectrics, such as silicon dioxide and the like, are pushed to the limits in view of leakage currents and the like. It has, therefore, been proposed to enhance the channel conductivity of the transistor elements by increasing the charge carrier mobility in the channel region for a given channel length, thereby offering the potential for achieving a performance improvement that is comparable with the advance to an advanced technology node while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region having a standard (100) surface orientation with the channel length direction oriented along the <110> direction may increase the mobility of electrons, which in turn may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

In one approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked, and subsequently the silicon/germanium layer is selectively formed in the PMOS transistor by epitaxial growth. Thus, complex manufacturing steps, such as etch processes, the formation of appropriate etch and growth masks and selective epitaxial growth techniques have to be incorporated into the CMOS process flow.

In other approaches, silicon/carbon material may be used for NMOS transistors to create a desired lattice mismatch specifically in the channel regions of the NMOS transistors, which may frequently be accomplished by ion implantation of carbon into the drain and source regions. However, the performance gain for transistors of different conductivity type on the basis of silicon/carbon alloys may lead to an even more complex process flow, as the various steps for the formation of respective strain layers by ion implantation may have to be appropriately integrated in the complex manufacturing flow, which may result in a less pronounced performance gain as expected.

In other conventional strategies, a silicon/carbon alloy may be formed on the basis of an epitaxial growth process, which may result in a desired high degree of tensile strain which, however, may result in an even more complex overall manufacturing flow. For example, in typical conventional process strategies, a process sequence including the encapsulation of a gate electrode structure, the etching of cavities laterally offset from a gate electrode structure and the subsequent selective epitaxial growth process is typically performed individually for P-channel transistors while masking the N-channel transistors. Similarly, the process sequence may be repeated for the N-channel transistors, while masking the P-channel transistor. Consequently, although the incorporation of an embedded strain-inducing semiconductor alloy in P-channel transistors and N-channel transistors may result in a significant increase of transistor performance for a given gate length, the high degree of complexity for implementing the process sequence described above into CMOS technology according to conventional strategies may be extremely cost intensive and may also result in an increased yield loss.

In view of the situation described above, the present disclosure relates to techniques and semiconductor devices having transistors of different conductivity type with embedded strain-inducing materials while avoiding, or at least reducing, one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and semiconductor devices in which differently strained semiconductor materials may be embedded into the active region of different types of transistors on the basis of a less complex manufacturing sequence. For example, in some illustrative aspects disclosed herein, a silicon/carbon alloy may be used in combination with a further semiconductor alloy, such as a silicon/germanium alloy, to provide different types of strain for transistors of different conductivity type, wherein at least some of the process steps required for incorporating a strain-inducing semiconductor alloy may be performed in a common process sequence. That is, in some illustrative aspects disclosed herein, at least the patterning of the cavities for the different transistors may be performed in a common etch sequence, thereby achieving enhanced process uniformity while also reducing overall process complexity. Furthermore, appropriate growth masks may be provided to enable a selective epitaxial growth of a different semiconductor material wherein, in some illustrative embodiments, the selectivity may be accomplished on the basis of a single lithography mask. Hence, the advantages of each of the different semiconductor alloys may be taken advantage of, while at the same time reducing the process complexity compared to conventional strategies in which a complex sequence for patterning cavities and filling the same with a semiconductor alloy may have to be performed twice for transistors of different conductivity type.

One illustrative method disclosed herein relates to forming strained semiconductor materials in transistors of different conductivity type. The method comprises forming first cavities in a first active region of a first transistor and second cavities in a second active region of a second transistor. Furthermore, a hard mask layer is selectively formed on exposed surface portions of the second cavities. Additionally, a first semiconductor alloy is formed in the first cavities by using the hard mask layer as a growth mask. Additionally, the method comprises removing the hard mask layer from within the second cavities and forming a second semiconductor alloy in the second cavities.

A further illustrative method disclosed herein comprises forming first cavities laterally offset from a first gate electrode structure of a first transistor and forming second cavities laterally offset from a second gate electrode structure of a second transistor, wherein the first and second transistors are of different conductivity type. Moreover, a first growth mask is selectively formed in the second cavities and a first semiconductor material is selectively formed in the first cavities by using the first growth mask. Additionally, the method comprises forming a second growth mask selectively above the first semiconductor material and forming a second semiconductor material selectively in the second cavities by using the second growth mask.

One illustrative semiconductor device disclosed herein comprises a first transistor comprising a first strain-inducing semiconductor alloy embedded at least partially in at least one of a drain region and a source region of the first transistor, wherein the first strain-inducing semiconductor alloy extends to a specified depth level. The semiconductor device further comprises a second transistor comprising a second strain-inducing semiconductor alloy that is embedded at least partially in at least one of a drain region and a source region of the second transistor, wherein the second strain-inducing semiconductor alloy extends to the specified depth level and wherein the first and second strain-inducing semiconductor alloys induce a different type of strain.

BRIEF DESCRIPTION OF THE DRAWINGS

The disclosure may be understood by reference to the following description taken in conjunction with the accompanying drawings, in which like reference numerals identify like elements, and in which.

Figure 1A:
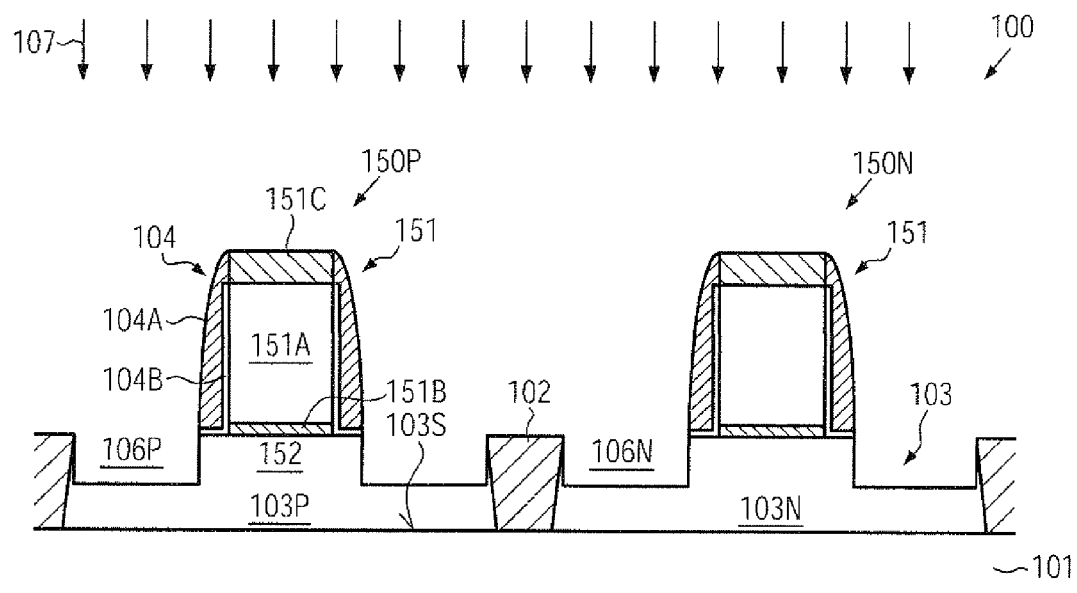
FIGS. 1*a*-1*g* schematically illustrate cross-sectional views of a semiconductor device including transistors of different conductivity type during various manufacturing stages, wherein a different type of strain-inducing semiconductor materials may be incorporated on the basis of a sophisticated manufacturing flow of reduced complexity, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques and semiconductor devices in which field effect transistors of different conductivity type may receive a strain-inducing semiconductor alloy in the drain and/or source regions in order to provide a desired magnitude and/or type of strain in the corresponding channel regions of these transistors. For this purpose, different semiconductor alloys may be used, such as silicon/germanium, silicon/germanium/tin, silicon/tin, silicon/carbon, on the basis of an appropriate manufacturing regime in which both materials may be embedded into the active regions of the corresponding transistors, i.e., in the drain and source areas, by performing at least the patterning process sequence for forming the cavities in the drain and source areas in a common process sequence. In this manner, the efficiency of the resulting manufacturing flow for incorporating different semiconductor alloys into different types of transistors may be significantly increased compared to conventional strategies, while at the same time the overall process uniformity may be improved due to a reduced degree of pattern loading during the etch process by avoiding the masking of one type of transistors while patterning the cavities for the other type of transistors, as is typically the case in conventional strategies. In some illustrative embodiments disclosed herein, an appropriate masking regime for providing respective growth masks may be accomplished on the basis of a single lithography step, thereby even further enhancing the overall efficiency of the manufacturing sequence. Consequently, based on the principles disclosed herein, transistors of different conductivity type or transistors requiring a different magnitude and/or type of strain may be provided with a high degree of uniformity with respect to the patterning sequence, thereby obtaining a high degree of flexibility in specifically designing transistor characteristics, such as the internal strain level in the channel regions on the basis of different semiconductor materials, which may be provided on the basis of separate selective epitaxial growth processes. Hence, performance of sophisticated transistor elements having a gate length of 50 nm and less may be improved on the basis of a cost-efficient and less failure-prone manufacturing flow compared to conventional strategies.

FIG. 1a schematically illustrates a cross-sectional view of a semiconductor device 100 which may comprise a first transistor 150P and a second transistor 150N at an early manufacturing stage. The semiconductor device 100 may comprise a substrate 101, which may represent any appropriate carrier material for forming thereabove a semiconductor layer 103, such as a silicon-based layer, the electronic characteristics of which may be locally adapted by generating a specific type of strain in the first and second transistors 150P, 150N. The semiconductor layer 103 may represent a silicon-based layer, i.e., a semiconductor material including a significant amount of silicon, wherein other components, such as germanium, carbon, dopant species and the like, may also be present. In some illustrative embodiments (not shown), a buried insulating layer may be positioned between the substrate 101 and the semiconductor layer 103, thereby defining a silicon-on-insulator (SOI) architecture, wherein it should be appreciated that, in other device areas of the device 100, a "bulk configuration" may be provided, depending on the overall device requirements. In the case of an SOI architecture, the semiconductor layer 103 may form an interface 103S on insulating material, thereby providing superior electric insulation of corresponding active regions 103P, 103N of the transistors 150P, 150N. Additionally, the active regions 103P, 103N, which may be understood as semiconductor regions having formed therein or receiving an appropriate dopant profile so as to establish appropriate PN junctions, may be delineated by isolation structures 102, such as shallow trench isolations and the like. For example, in an SOI configuration, the shallow trench isolations 102 may extend to the buried insulating layer (not shown), while, in a bulk configuration, the isolation trenches 102 may extend down to a specific depth.

Furthermore, the transistors 150P, 150N may comprise associated gate electrode structures 151, which may include, in the manufacturing stage shown, an electrode material 151A that is formed on a gate insulation layer 151B, which in turn separates the electrode material 151A from a channel region 152. The gate electrode material 151A may be provided in the form of any appropriate material, such as polysilicon and the like, while, in other cases, the material 151A may, at least partially, be replaced by a material of enhanced conductivity in a later manufacturing stage, depending on the overall process and device requirements. In other cases, the gate electrode material 151A may comprise a metal-containing material connecting to the gate insulation layer 151B if sophisticated applications are considered. Similarly, the gate insulation layer 151B may be comprised of any appropriate dielectric material, such as silicon dioxide-based materials, silicon nitride, silicon oxynitride, high-k dielectric materials, such as hafnium oxide, zirconium oxide and the like, possibly in combination with conventional dielectrics. Additionally, the gate electrode structures 151 may comprise a cap layer 151C, which may be comprised of silicon nitride and the like. Additionally, the gate electrode structure 151 may have formed on sidewalls thereof a spacer structure 104, which may have any appropriate configuration so as to act as an etch mask and a growth mask during the subsequent manufacturing processes. For example, the spacer structure 104 may comprise a spacer element 104A, such as a silicon nitride spacer and the like, possibly in combination with a liner material 104B, such as silicon dioxide, silicon nitride and the like. Consequently, the spacer structure 104 in combination with the cap layer 151C may reliably encapsulate the electrode material 151A and the gate insulation layer 151B during the further processing. Additionally, in this manufacturing stage, cavities 106P may be provided in the active region 103P and cavities 106N may be formed in the active region 103N, wherein a lateral offset from the corresponding gate electrode material 151A may be substantially defined by the spacer structure 104. It should be appreciated that, in other illustrative embodiments (not shown), the lateral extension of the cavities 106P, 106N may be independent from the spacer structure 104, for instance when a certain degree of "underetching" of the gate electrode material 151A may be considered appropriate. In this case, the cavities 106P, 106N may extend into the channel region 152 in accordance with device requirements.

The semiconductor device as illustrated in FIG. 1a may be formed on the basis of the following processes. Prior to or after defining the basic transistor characteristics of the devices 150P, 150N, for instance by introducing an appropriate well doping, such as a P-type dopant for N-channel transistors and an N-type doping for P-channel transistors, the isolation structures 102 may be formed in accordance with well-established process techniques. For example, the active regions 103P, 103N laterally separated by the isolation structure 102 may represent the active region of a P-channel transistor and an N-channel transistor, respectively. It should be appreciated that although the incorporation of different strain-inducing semiconductor materials into transistors of different conductivity type may be highly advantageous in view of enhancing the overall performance of the device 100, in other cases, different semiconductor materials or semiconductor materials differing at least in one characteristic, such as material composition and the like, may also be introduced into transistors of the same conductivity type, if considered appropriate, to provide different "versions" of the same conductivity type. In this case, the active regions 103P, 103N may have the basic doping that may result in the same conductivity type. Next, the gate electrode structures 151 may be formed by well-established techniques, which may include the oxidation and/or deposition of a gate dielectric material 151B followed by the deposition of the gate electrode material 151A and the material of the cap layer 151C. The resulting material stack may be patterned by sophisticated lithography and etch techniques in accordance with the design rules of the device 100. For example, in sophisticated applications, a gate length, i.e., in FIG. 1a, the horizontal extension of the electrode material 151A, may be approximately 50 nm and less, for example 35 nm and less. Next, the spacer structure 104 may be formed, for instance by providing the liner 104B, which may be accomplished by oxidation and the like, depending on the material characteristics of the electrode material 151A. In other cases, the liner 104B may be formed by sophisticated deposition techniques, such as thermally activated chemical vapor deposition (CVD) and the like. Subsequently, a spacer layer may be formed by any appropriate deposition technique, for instance on the basis of a silicon nitride material which may then be patterned by using well-established anisotropic etch techniques, wherein the control of this etch process may be accomplished on the basis of the liner material 104B. Consequently, contrary to conventional strategies, the spacer structure 104 may be formed on both transistors 150P, 150N, which may also contribute to overall process uniformity, for instance with respect to the width of the spacer structure 104 and the like. Furthermore, any lithography processes which may typically be required in conventional strategies to selectively pattern the spacer layer for one of the transistors 150P, 150N, while masking the other transistor, may be omitted, thereby also contributing to a reduced overall process complexity. Thereafter, the semiconductor device 100 may be exposed to an etch ambient 107, which may represent any appropriate etch process or sequence of etch processes in order to obtain the cavities 106P, 106N with a desired size and shape. For example, the etch process 107 may include an anisotropic plasma assisted etch process for forming a substantially rectangular-shaped cavity, while, in other illustrative embodiments, in addition to or alternatively to a plasma assisted anisotropic etch process, an etch process having an increased lateral etch rate may be applied. For example, a plurality of wet chemical etch recipes are available, in which even a crystallographically anisotropic etch behavior may result in a well-controllable lateral removal rate to "drive" the cavities 106P, 106N into the channel region 152 as required by the overall device configuration. It should be appreciated that, irrespective of whether the etch process 107 may be performed as a single etch process or as a sequence of two or more etch processes, a high degree of uniformity may be accomplished for both transistors 150P, 150N. Consequently, the size and shape of the cavities 106P, 106N may be substantially identical.

Figure 1B:
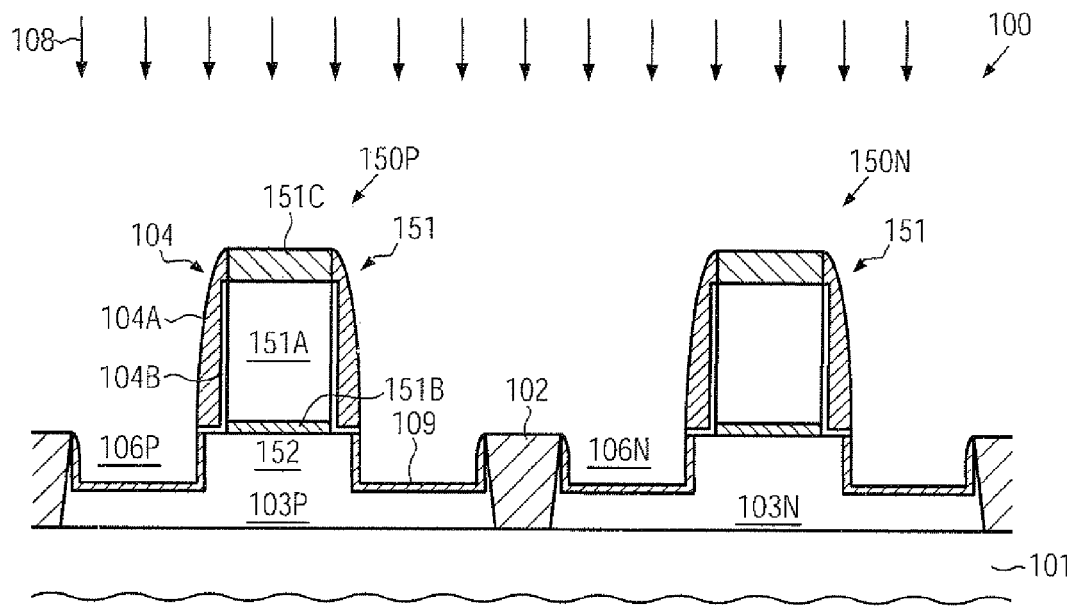

FIG. 1b schematically illustrates the semiconductor device 100 in a further advanced manufacturing stage in which the device 100 is exposed to a process ambient 108 for forming a material layer 109, at least on exposed surface areas of the cavities 106P, 106N. In one illustrative embodiment, the process ambient 108 may represent a deposition ambient for forming any appropriate material, which may be used as a growth mask in a later manufacturing stage. For example, the material layer 109 may be comprised of silicon dioxide, silicon nitride and the like. For example, the deposition of the material layer 109 may be accomplished by using well-established plasma assisted or thermally activated CVD techniques in which a conformal layer with a thickness in the range of several nanometers to approximately 10 nm may be deposited. In other illustrative embodiments, as shown in FIG. 1b, the ambient 108 may represent a surface treatment to modify at least the exposed surface areas of the cavities 106P, 106N into a material providing the desired mask characteristics. For instance, the process 108 may represent a nitridation process in which a nitrogen species may be incorporated into surface areas, thereby forming a silicon nitride-like material within the cavities 106P, 106N. In a further illustrative embodiment, the process 108 may be performed on the basis of an oxidizing ambient, thereby obtaining the material layer 109 in the form of an oxide material, which may be selectively formed on exposed surface areas of the cavities 106P, 106N. For instance, the process 108 may be performed at elevated temperatures as a furnace process, thereby accomplishing a well-controllable oxidation process in order to convert semiconductor material into a semiconductor oxide in a precise manner. In other cases, a rapid thermal anneal process may be used on the basis of appropriately selected parameters in order to form an oxide layer with a desired thickness in the range of 1 nm to several nanometers, depending on the overall requirements. In still other illustrative embodiments, an oxidation process may be performed in a plasma ambient, while in other cases a wet chemical oxidation process may be performed in which appropriate chemicals may be used, which may even provide a self-limiting oxidation of exposed silicon material on the basis of well-established etch recipes.

Figure 1C:
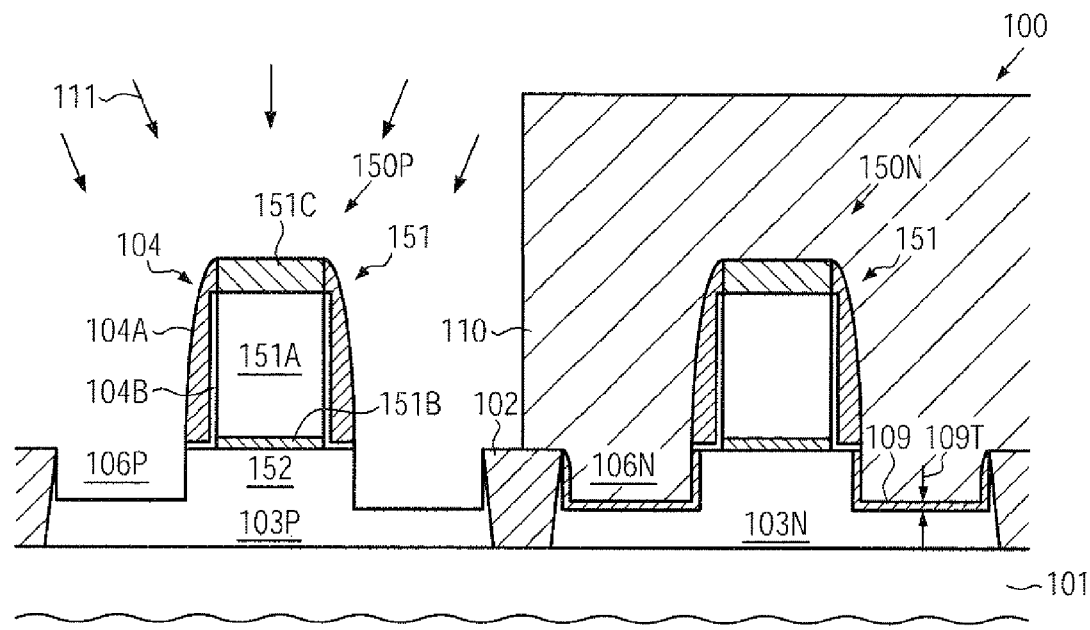

FIG. 1c schematically illustrates the semiconductor device 100 in a further advanced manufacturing stage in which an etch mask 110, such as a resist mask and the like, is provided to expose the transistor 150P, while covering the transistor 150N. Furthermore, the device 100 is exposed to an etch ambient 111 that is appropriately designed to remove the exposed portion of the layer 109 selectively to material of the active region 103P and the spacer structure 104 and the cap layer 151C. For instance, a plurality of well-established etch recipes are available, such as hydrofluoric acid for etching silicon dioxide material selectively with respect to silicon material, silicon nitride material and the like. In other cases, hot phosphoric acid may be used when the material layer 109 may be comprised of silicon nitride and the like. It should be appreciated that, in this case, the layer 109 may have also been formed on the spacer structure 104 and the cap layer 151C during the process 108 (FIG. 1b), so that these components may not be unduly affected during the etch process 111. Thus, a growth mask 109N may be obtained selectively within the cavities 106N due to the etch mask 110, which may have an appropriate material composition and thickness for withstanding the subsequent process steps and also act as a growth mask in a selective epitaxial growth process to be performed in a later manufacturing stage. For example, a thickness 109T may be selected such that any subsequent cleaning processes and other surface treatments for preparing the device 100 for a selective epitaxial growth process may still preserve a specific residual thickness of the mask 109N in order to provide the required selectivity in the subsequent growth process. For instance, if the growth mask 109N is comprised of silicon dioxide, an initial thickness of 2-5 nm may be selected wherein, however, any other values may be used depending on the process parameters of subsequent process steps. After the etch process 111, the etch mask 110 may be removed by wet chemical or plasma assisted resist strip techniques and the like, possibly followed by additional cleaning processes, for instance on the basis of diluted hydrofluoric acid. As explained before, corresponding cleaning processes may consume a portion of the mask 109N, wherein, however, the initial thickness 109T may be appropriately selected in combination with the process parameters of the cleaning processes and further process steps so as to reliably cover exposed portions of the cavities 106N.

Figure 1D:
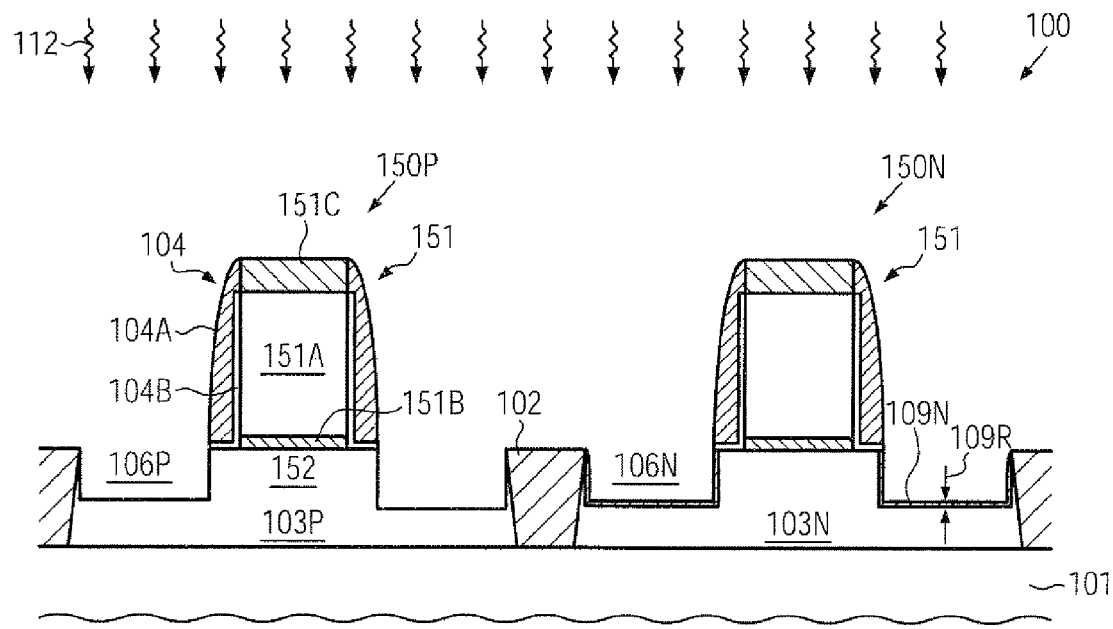

FIG. 1d schematically illustrates the semiconductor device 100 when exposed to a further process ambient 112, in which elevated temperatures may be applied, for instance, for preparing the device 100 for a subsequent epitaxial growth process, wherein any native oxides may also be removed from within the cavities 106P. As indicated, due to the appropriate selection of the thickness 109T (FIG. 1c), the growth mask 109N may still have an appropriate thickness 109R after completing the process 112, even if the growth mask 109N may be comprised of a silicon dioxide material. In other cases, for instance by providing a silicon nitride material, any cleaning processes and the treatment 112 may have no significant influence on the growth mask 109N, thereby providing enhanced flexibility in selecting respective process parameters and the initial thickness 109T of the growth mask 109N.

Figure 1E:
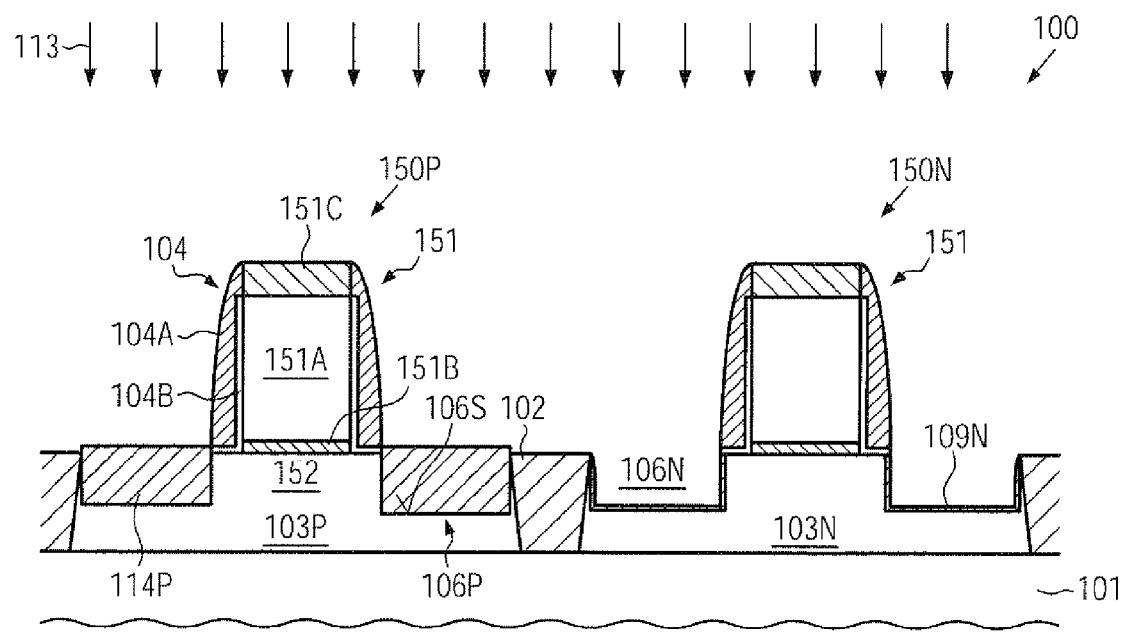

FIG. 1e schematically illustrates the semiconductor device 100 during a selective epitaxial growth process 113. As is well known, a selective epitaxial growth process may be performed on the basis of appropriately selected process parameters, such as substrate temperature, flow rates of precursor materials and carrier gases, pressure and the like, so that a significant deposition of material may be restricted to crystalline areas, i.e., the surface areas 106S of the cavities 106P only, while a pronounced material deposition on other surface areas, such as dielectric materials, may be substantially suppressed. Consequently, during the selective epitaxial growth process 113, the growth mask 109N may suppress any significant material deposition within the cavities 106N. On the other hand, a semiconductor material, such as a semiconductor alloy 114P, may be selectively deposited in the cavities 106P, thereby forming a substantially strained crystalline state due to a corresponding mismatch between the natural lattice constants of the material 114P with respect to material of the active region 103P, which may act as a template material for the growth of the material 114P. For example, if a compressive strain component may be desired in the adjacent channel region 152, the material 114P may be provided in the form of a silicon/germanium alloy, a silicon/germanium/tin alloy, a silicon/tin alloy, wherein a specific fraction of germanium and/or tin may result in a more or less pronounced degree of lattice mismatch and thus of internal strain. Consequently, by controlling material composition and the type of components used, a desired type and magnitude of strain may be generated in the channel region 152. In other illustrative embodiments, the material 114P may represent a semiconductor alloy resulting in a tensile strain component which may be accomplished by providing a silicon/carbon material in the cavities 106P. It should be appreciated that, in addition to the strain component and the type of strain, other transistor characteristics may also be adjusted, for instance by incorporating dopant species, or any other atomic species which may result in the desired transistor performance. Consequently, by providing a very efficient manufacturing flow for incorporating different semiconductor materials, in addition to or alternatively to adjusting different strain levels, other transistor characteristics may also be specifically designed on the basis of the epitaxially grown semiconductor materials.

Figure 1F:
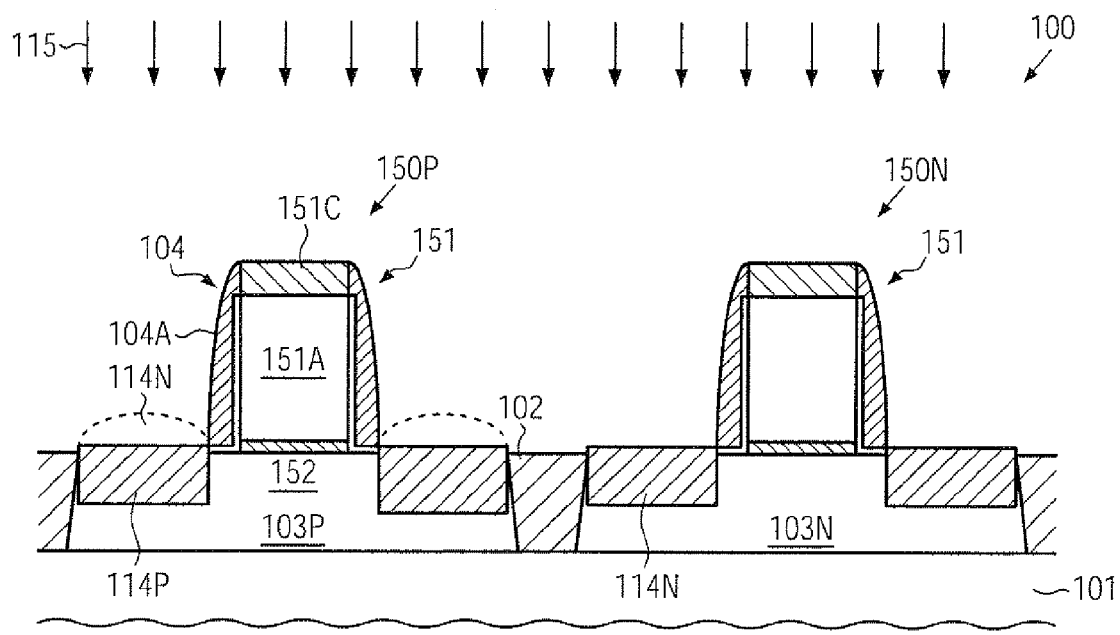

FIG. 1f schematically illustrates the semiconductor device 100 in a further advanced manufacturing stage. As illustrated, the device 100 may be exposed to a further selective epitaxial growth ambient 115 in order to grow a further semiconductor material 114N, such as a strain-inducing semiconductor alloy and the like, wherein, additionally, further components, such as dopant species and the like, may be incorporated. For example, the semiconductor alloy 114N may represent a silicon/carbon alloy if the transistor 150N may require a tensile strain component. Prior to establishing the ambient 115, the growth mask 109N (FIG. 1e) may be removed after the deposition of the material 114P, for instance on the basis of any appropriate etch recipe, such as hydrofluoric acid and the like, when the material 109N is comprised of a silicon dioxide material. In other cases, any other recipes, such as hot phosphoric acid and the like, may be used, for instance in the case of a silicon nitride-based material. Thereafter, any further processes, such as removing a native oxide and the like, may be performed, for instance as previously described. Thereafter, the ambient 115 may be established to deposit the material 114N, wherein a certain amount of material may also be deposited on the material 114P, which may be removed in a subsequent manufacturing stage, if required, by providing an etch mask such as a resist mask and removing the material 114N from above the material 114P. In other embodiments, the material 114N may be maintained in the transistor 150P if considered appropriate and compatible with the further processing of the semiconductor device 100.

Figure 1G:
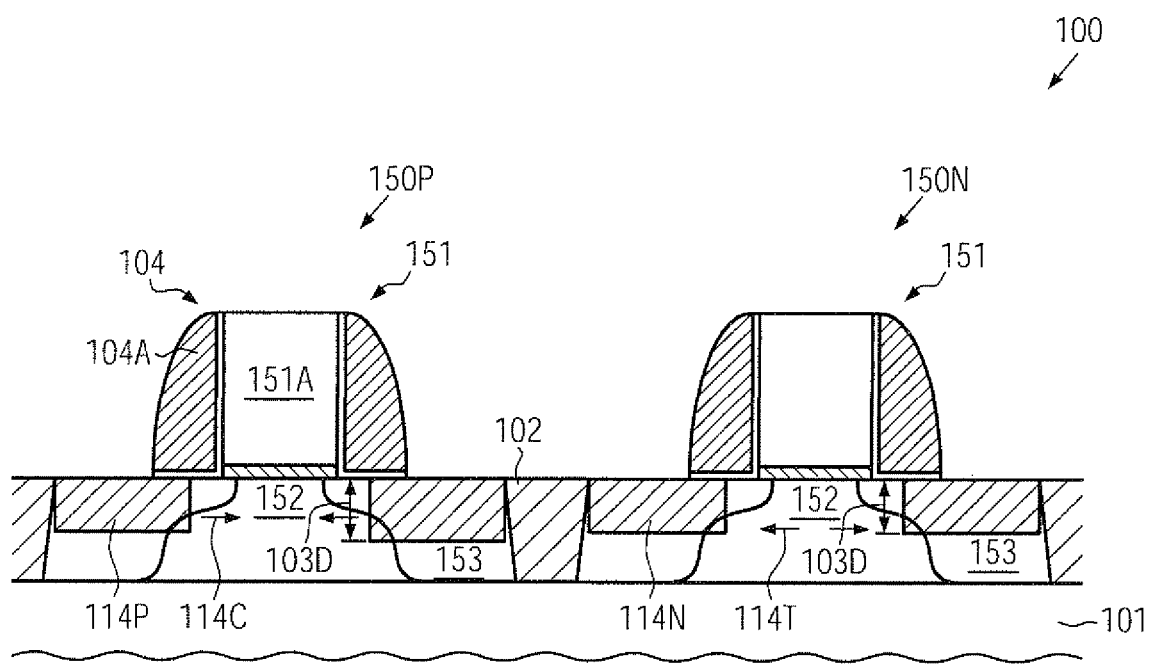

FIG. 1g schematically illustrates the semiconductor device 100 in a further advanced manufacturing stage. As shown, the transistors 150P, 150N may comprise drain and source regions 153 in which may be embedded, at least partially, the semiconductor materials 114P, 114N, respectively. Furthermore, a sidewall spacer structure 104 may be formed on sidewalls of the gate electrode structures. The device 100 as illustrated in FIG. 1g may be formed on the basis of well-established process techniques which may, for instance, comprise appropriate implantation sequences for introducing a desired type of dopant species in accordance with the overall transistor configuration and the conductivity type of the devices 150P, 150N, wherein respective portions of the spacer structure 104 may also act as an implantation mask. After the final implantation process, an anneal process may be performed to activate the dopant species, which may at least partially be incorporated by ion implantation, while, in other cases, as previously explained, one or both of the materials 114P, 114N may have incorporated therein a dopant species which may be appropriately diffused into the surrounding semiconductor material on the basis of the anneal process. In other cases, if a pronounced dopant diffusion may not be required, other anneal techniques may be used in which the effective anneal time may be restricted to milliseconds and less on the basis of well-established laser-based or flashlight-based anneal techniques. Furthermore, implantation-induced damage may be re-crystallized during the annealing of the device 100. Consequently, the materials 114P, 114N may provide a desired strain component in the adjacent channel regions 152 such as a compressive strain component 114C in the case of a P-channel transistor and a tensile strain component 114T in the case of an N-channel transistor. Moreover, as previously explained, due to the enhanced degree of process uniformity, at least during the patterning of the cavities 106P, 106N (FIG. 1a), the semiconductor materials 114P, 114N may extend to a depth level, indicated as 103D, which may be substantially equal in the transistors 150P, 150N.

With reference to FIGS. 1h-1m, further illustrative embodiments will now be described in more detail in which a second growth mask may be selectively formed above the previously deposited semiconductor alloy without requiring an additional lithography process.

Figure 1H:
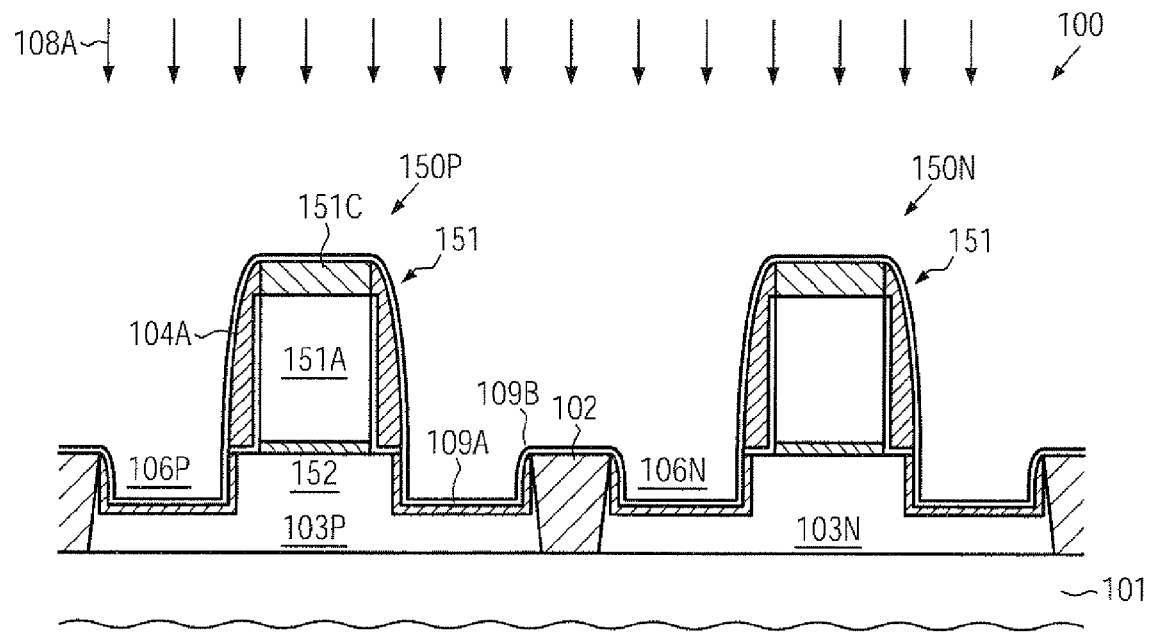
FIGS. 1*h*-1*m* schematically illustrate cross-sectional views of the semiconductor device during various manufacturing stages in providing two individual growth masks on the basis of a single lithography process, according to still further illustrative embodiments.

FIG. 1h schematically illustrates the semiconductor device 100 during a process 108A in which the mask layer 109 may be provided in such a form that it may also be used as an etch mask in a further advanced manufacturing stage in order to provide an additional growth mask without requiring a lithography process. For example, as previously explained, the mask layer 109 may be formed as any appropriate dielectric material such as silicon nitride, silicon oxynitride and the like, which may have a moderately high etch selectivity with respect to a further mask material to be formed in a later stage. For this purpose, the process 108A may comprise any appropriate deposition technique and the like. In the embodiment shown, the mask layer 109 may comprise a first material layer 109A and a second material layer 109B, which may have a different material composition so that, for instance, the layer 109A may act as an etch stop material for the layer 109B, when the material 109B may not exhibit a desired high etch selectivity with respect to the semiconductor material of the active regions 103P and 103N. In one illustrative embodiment, the first material layer 109A may be formed as a silicon dioxide material, which may be accomplished by deposition or oxidation, as previously explained. In this case, the thickness of the layer 109A may be adjusted to a value of approximately 1 nm to several nanometers, depending on the overall requirements. Furthermore, the layer 109B may be provided in the form of a silicon nitride material and the like, wherein, in one illustrative embodiment, the material 109B may represent a substantially non-oxidizable material such as silicon nitride. For example, the layer 109B may be deposited on the basis of well-established CVD techniques.

Figure 1I:
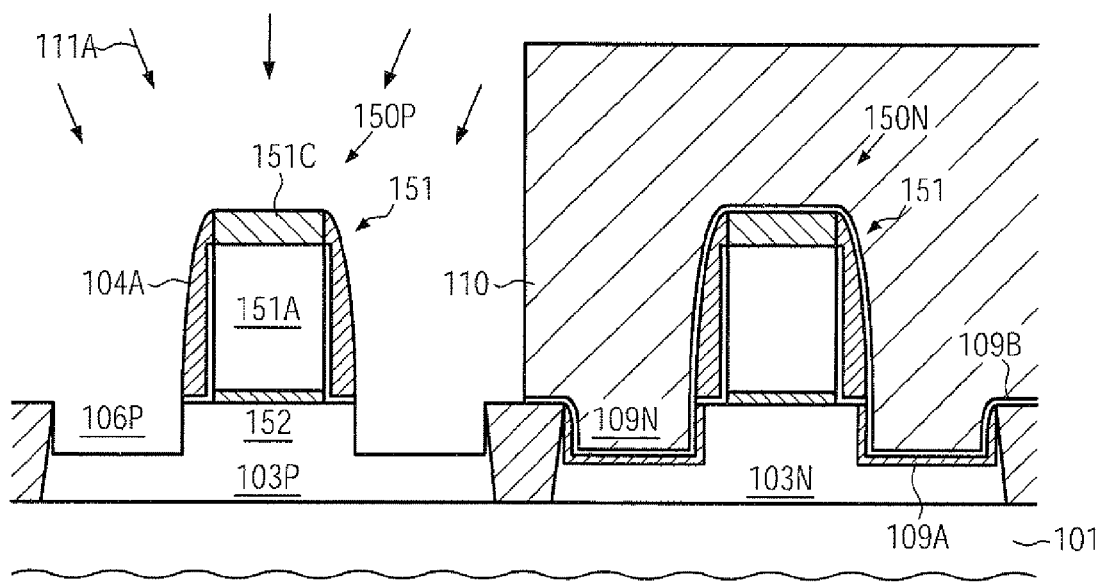

FIG. 1i schematically illustrates the semiconductor device 100 with the etch mask 110 formed above the transistor 150N so as to expose the transistor 150P to an etch ambient 111A which may be appropriately established in order to remove the exposed portion of the layer 109A, 109B. For example, in a first etch step, the layer 109B may be removed while using the material 109A as an etch stop material. Consequently, a highly controllable etch process may be achieved, irrespective of the characteristics of the material 109B. It should be appreciated that the cap layer 151C and the spacer 104A may not be unduly affected by the process 111A since the material layer 109B may represent a substantially conformal material with a thickness of one to several nanometers so that the layer 109B may be removed substantially simultaneously at any device area, thereby not causing a significant material erosion of the components 151C and 104A, even if these components are comprised of substantially the same material composition. Thereafter, the layer 109A may be removed wherein, due to a moderately reduced thickness, a very controllable etch process may be achieved without unduly causing a material erosion within the cavities 106P. In other illustrative embodiments (not shown), the layer 109A, 109B may represent a substantially homogenous material which may be efficiently removed during the process 111A. Thereafter, the etch mask 110 may be removed and the further processing may be continued by preparing the device 100 for a subsequent selective epitaxial growth process. It should be appreciated that an enhanced resistance with respect to any cleaning processes at high temperature processes may be accomplished by means of the layer 109A, 109B by appropriately selecting the material composition thereof. For example, silicon nitride may exhibit a superior etch resistivity with respect to a plurality of well-established cleaning processes. In the embodiment shown, at least the layer 109B may provide a superior etch resistivity with respect to well-established cleaning recipes, such as hydrofluoric acid.

Figure 1J:
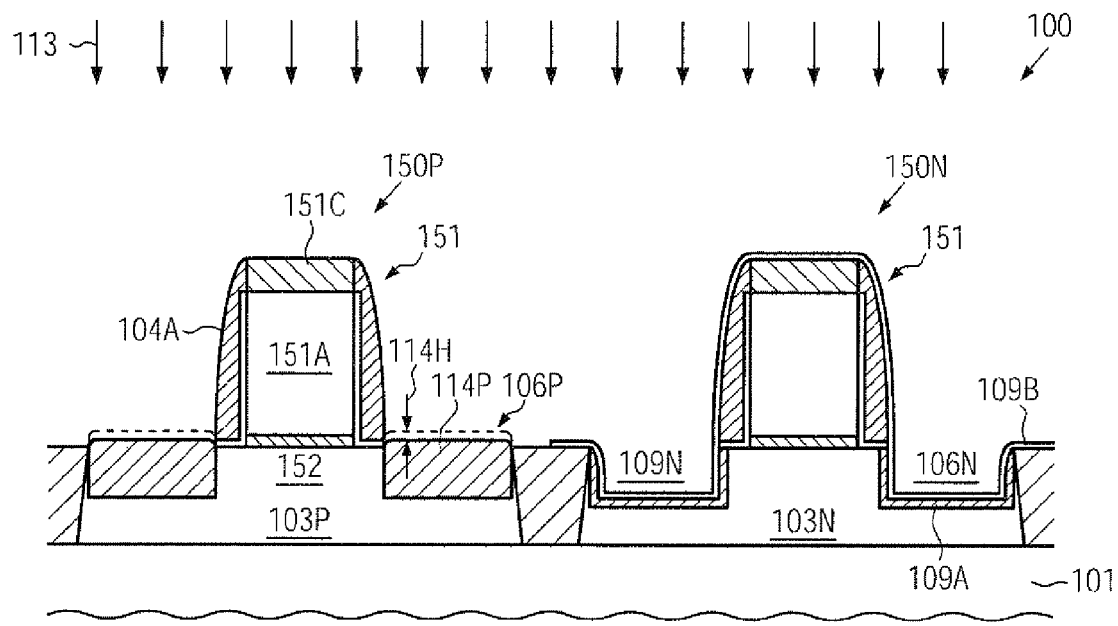

FIG. 1j schematically illustrates the semiconductor device 100 during the selective epitaxial growth process 113, during which the semiconductor alloy 114P may be selectively deposited in the cavities 106P while the growth mask 109N may reliably suppress any undue material deposition in the cavities 106N. In the deposition 113, the material 114P may, if desired, be provided with an extra height 114H so as to take into consideration a subsequent formation of a second growth mask by a surface treatment, such as an oxidation process.

Figure 1K:
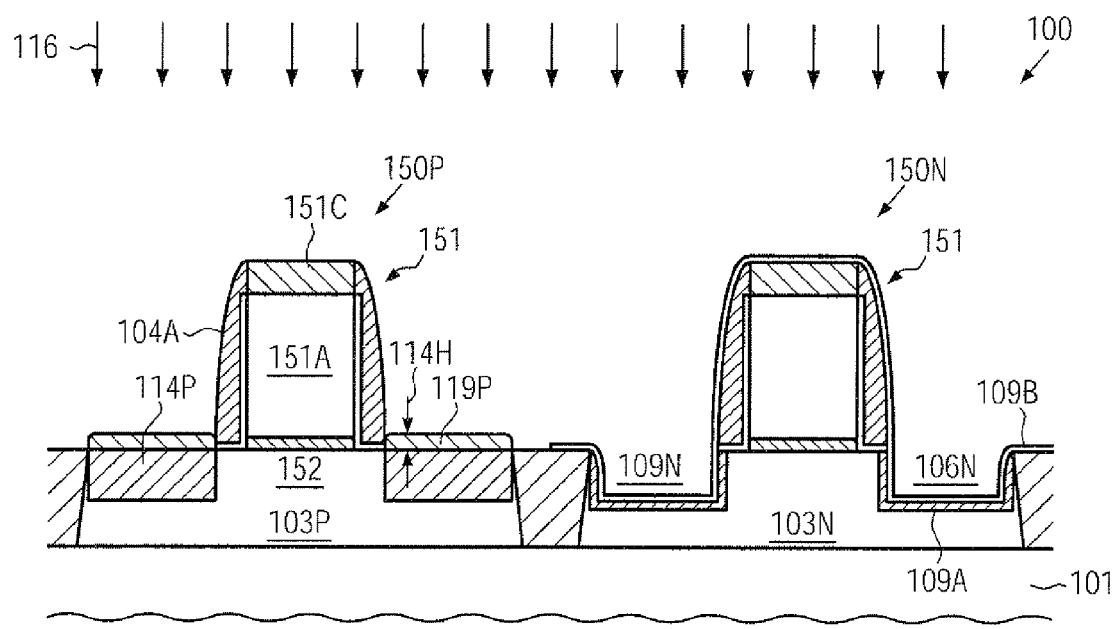

FIG. 1k schematically illustrates the semiconductor device 100 when exposed to a surface treatment process 116 in order to form a second growth mask 119P, for instance by converting a portion of the material 114P into an appropriate mask material, such as an oxide, a nitride and the like. For example, in one illustrative embodiment, the process 116 may represent an oxidation process which may be performed in a process ambient of elevated temperature including an oxidizing atmosphere, a plasma ambient, a rapid thermal anneal ambient, a wet chemical ambient and the like. For example, the extra height 114H may substantially correspond to a thickness of the second growth mask 119N, which may be accomplished by appropriately selecting the extra height 114H and the process parameters of the treatment 116. On the other hand, the mask 109N may substantially prevent a modification of material of the active region 103N. As previously explained, in some illustrative embodiments, the growth mask 109N may be comprised of a substantially non-oxidizable material, such as silicon nitride and the like.

Figure 1L:
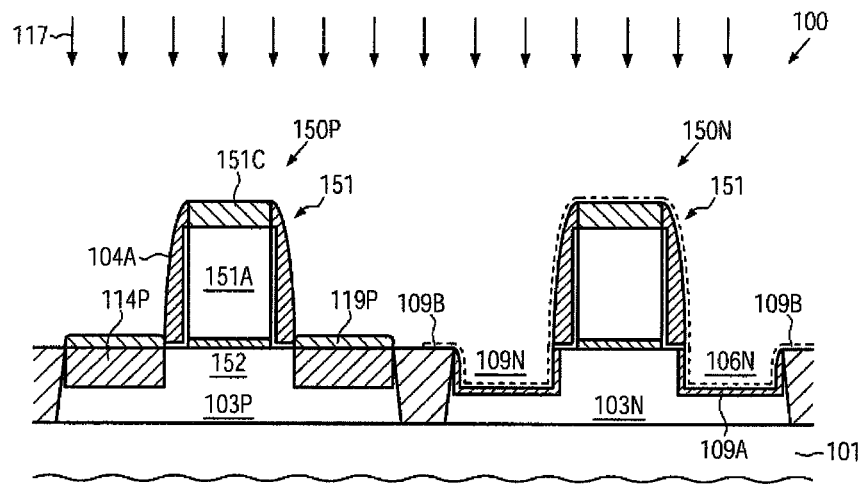

FIG. 1l schematically illustrates the semiconductor device 100 when exposed to an etch process 117 that may be appropriately designed to remove at least a portion of the growth mask 109N. For example, if the growth mask 109N is comprised of a substantially homogenous material, the mask 109N may be substantially completely removed during the etch process 117, for instance by using hot phosphoric acid in the case of a silicon nitride material. In the embodiment shown, the etch process 117 may remove the layer 109B selectively with respect to the layer 109A and also selectively with respect to the growth mask 119P. It should be appreciated that the layer 109B may be initially formed with a reduced thickness when provided in combination with the etch stop layer 109A so that a corresponding material erosion of the cap layer 151C and the spacer 104A in the transistor 150P may not negatively affect the further processing of the device 100. Furthermore, the removal of the layer 109B may substantially not affect the active region 103N. Thus, a high degree of controllability may be obtained even if, in total, layers of very low thickness values may be used for the materials 109B, 109A.

Figure 1M:
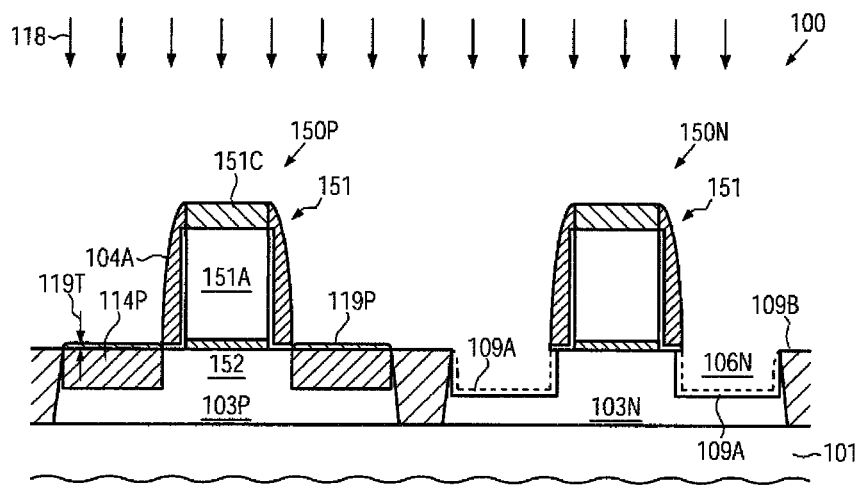

FIG. 1m schematically illustrates the device 100 according to further illustrative embodiments in which a further etch process 118 may be performed, for instance on the basis of hydrofluoric acid and the like, to remove the layer 109A. In this case, a material removal may occur in the growth mask 119P, wherein, however, due to the moderately low thickness of the layer 109A and due to an appropriately selected initial thickness 114H (FIG. 1k), a reliable residual thickness 119T may be maintained above the previously grown material 114P. Moreover, due to a reduced initial thickness of the material 109A, a well-controllable etch process may also be obtained in the transistor 150N for exposing the cavities 106N. Thereafter, any further cleaning processes and the like may be performed, wherein the growth mask 119P may also provide the desired integrity of the material 114P, which may be accomplished by appropriately selecting the remaining thickness 119T, as is also previously discussed. Thereafter, the further processing may be continued by performing a further selective epitaxial growth process for filling the cavities 106N while the mask 119P may reliably suppress undue material deposition above the previously deposited material 114P. Consequently, any further lithography steps for removing material from above the semiconductor alloy 114P may be avoided, which may further contribute to the overall efficiency of the manufacturing technique described above.

As a result, the present disclosure provides semiconductor devices and manufacturing techniques in which semiconductor alloys of different material composition may be provided in separate epitaxial growth processes, while, however, maintaining the overall complexity at a low level. For this purpose, the patterning of cavities may be performed in a common etch sequence and, thereafter, appropriate growth masks may be selectively formed, wherein, in some illustrative embodiments, two growth masks may be provided on the basis of a single lithography process. Thus, semiconductor alloys of different types of strain may be efficiently incorporated into different transistor elements on the basis of any uniform process sequence and on the basis of a high degree of controllability, while nevertheless reducing the degree of process complexity compared to conventional strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming strained semiconductor materials in transistors of different conductivity type, the method comprising:
   forming first cavities in a first active region of a first transistor and second cavities in a second active region of a second transistor;
   forming a hard mask layer selectively on exposed surface portions of said second cavities, wherein forming said hard mask layer comprises forming a material layer at least on exposed surfaces of said first and second cavities, forming an etch mask to expose said first cavities and cover said second cavities and removing said material layer from said first cavities by using said etch mask;
   forming a first semiconductor alloy in said first cavities by using said hard mask layer as a growth mask;
   removing said hard mask layer from within said second cavities;
   forming a second semiconductor alloy in said second cavities; and
   removing material of said second semiconductor alloy from said first semiconductor alloy.

2. The method of claim 1, wherein forming said material layer at least on exposed surfaces of said first and second cavities comprises performing a treatment in an oxidizing ambient.

3. The method of claim 1, further comprising performing a cleaning process prior to forming said first semiconductor alloy and selecting at least one characteristic of said hard mask layer so as to preserve a residual thickness of said hard mask layer during said cleaning process.

4. The method of claim 1, wherein forming said first and second cavities comprises forming a first gate electrode structure of said first transistor above said first active region and forming a second gate electrode structure of said second transistor above said second active region and etching said first cavities laterally offset from said first gate electrode structure and said second cavities laterally offset from said second gate electrode structure in a common etch process.

5. The method of claim 1, wherein said first semiconductor alloy induces a first type of strain in a channel region of said first transistor and said second semiconductor alloy induces a second type of strain in a channel region of said second transistor and wherein said first type of strain is different from said second type of strain.

6. The method of claim 1, wherein said first semiconductor alloy comprises a silicon/germanium alloy and said second semiconductor alloy comprises a silicon/carbon alloy.

7. A method of forming strained semiconductor materials in transistors of different conductivity type, the method comprising:
   forming first cavities in a first active region of a first transistor and second cavities in a second active region of a second transistor;
   forming a hard mask layer selectively on exposed surface portions of said second cavities, wherein forming said hard mask layer comprises forming a first material layer on said exposed surfaces of said first and second cavities and forming a second material layer on said first material layer, wherein said first and second material layers have different etch characteristics;
   forming a first semiconductor alloy in said first cavities by using said hard mask layer as a growth mask;
   removing said hard mask layer from within said second cavities;
   forming a second semiconductor alloy in said second cavities; and
   removing material of said second semiconductor alloy from said first semiconductor alloy.

8. The method of claim 7, further comprising forming a second hard mask layer selectively on said first semiconductor alloy and removing said hard mask layer from said second cavities by using said second hard mask layer as an etch mask.

9. The method of claim 8, wherein said second semiconductor alloy is formed by using at least a portion of said second hard mask layer as a growth mask.

10. The method of claim 8, wherein said second hard mask layer is formed by performing a treatment in an oxidizing ambient.

11. A method, comprising;
forming first cavities laterally offset from a first gate electrode structure of a first transistor and second cavities laterally offset from a second gate electrode structure of a second transistor;
forming a first growth mask selectively in said second cavities, wherein forming said first growth mask comprises forming a material layer at least on exposed surfaces of said first and second cavities, forming an etch mask so as to expose said material layer in said first cavities and cover said second cavities and performing an etch process to remove said exposed material layer;
forming a first semiconductor material selectively in said first cavities by using said first growth mask;
forming a second growth mask selectively above said first semiconductor material, wherein forming said second growth mask comprises converting at least a portion of said first semiconductor material; and
forming a second semiconductor material selectively in said second cavities by using said second growth mask, said second semiconductor material differing from said first semiconductor material in at least one characteristic.

12. The method of claim 11, wherein forming said material layer comprises performing a treatment in an oxidizing ambient.

13. The method of claim 11, wherein forming said material layer comprises depositing a substantially non-oxidizable material.

14. The method of claim 11, wherein forming said second growth mask comprises performing a treatment in an oxidizing ambient to form an oxide material on said first semiconductor material and using said first growth mask as an oxidation mask.

15. The method of claim 11, wherein forming said material layer comprises forming a first layer on said exposed surfaces of said first and second cavities and forming a second layer above said first layer, wherein said first and second layers have a different material composition.

16. The method of claim 11, wherein said material layer comprises nitrogen.

17. The method of claim 11, wherein said first semiconductor material induces a first type of strain in a channel region of said first transistor and said second semiconductor material induces a second type of strain in a channel region of said second transistor, wherein said first type of strain is different from said second type of strain.

* * * * *